United States Patent [19]

Hattori et al.

[11] Patent Number: 5,693,560
[45] Date of Patent: Dec. 2, 1997

[54] SEMICONDUCTOR DEVICE ELECTRODE

[75] Inventors: Ryo Hattori, Itami; Yasutaka Kohno, deceased, late of Saijyo, by Yoko Kohno, legal representative; Tetsuro Kunii, Itami, all of Japan

[73] Assignee: Mitsubishi Denki Kabushiki Kaisha, Tokyo, Japan

[21] Appl. No.: 532,277

[22] Filed: Sep. 22, 1995

[30] Foreign Application Priority Data

Sep. 27, 1994 [JP] Japan ................ 6-231218

[51] Int. Cl.⁶ .................................... H01L 21/44
[52] U.S. Cl. ............... 437/184; 437/189; 437/192; 437/193; 437/200; 204/290 R
[58] Field of Search .............. 204/290 R; 437/184, 437/189, 192, 193, 200

[56] References Cited

U.S. PATENT DOCUMENTS 5,422,307 6/1995 Ishii ........................ 437/184
5,496,748 3/1996 Hattori et al. .............. 437/184

FOREIGN PATENT DOCUMENTS

| 60-219765 | 11/1985 | Japan . |
| 61-117869 | 6/1986 | Japan . |
| 2155271 | 6/1990 | Japan . |

*Primary Examiner*—Bruce F. Bell
*Attorney, Agent, or Firm*—Leydig, Voit & Mayer, Ltd.

[57] ABSTRACT

An electrode of a semiconductor device includes an oxygen absorbing layer disposed on a surface of a semiconductor layer and a refractory metal layer disposed on the oxygen absorbing layer. Oxygen of a spontaneous oxide film on the semiconductor layer is taken to the oxygen absorbing layer, preventing the formation of interface levels within an interface metamorphic layer, preventing $I_d$ drifting.

16 Claims, 5 Drawing Sheets

6,693,560

SEMICONDUCTOR DEVICE ELECTRODE

FIELD OF THE INVENTION

The present invention relates to an electrode of a semiconductor device and a fabricating method thereof, and more particularly, to a gate electrode of a field effect transistor (referred to as an FET hereinafter) comprising a compound semiconductor and a fabricating method thereof.

BACKGROUND OF THE INVENTION

For an FET comprising a compound semiconductor (GaAs, InP, etc.). such as a high output and highly reliable MESFET and an HEMT (High Electron Mobility Transistor), an electrode comprising a refractory metal is often used. FIG. 5 is a cross-sectional view of a conventional gate electrode comprising a refractory metal of a GaAs MESFET. WSi is used as the refractory metal and the cross-section is T-shaped, the upper width being larger than the lower width. In the figure, reference numeral 1 designates a semi-insulating GaAs substrate, reference numeral 2 designates an n type GaAs layer, reference numeral 3 designates a recess groove, reference numeral 4 designates a gate electrode, reference numeral 4a designates a WSi layer, reference numeral 4b designates an Au layer, reference numeral 5 designates a source electrode, reference numeral 6 designates a drain electrode, and reference numeral 8 designates a GaAs spontaneous oxide film.

The WSi layer 4a, which is a refractory metal layer, and the n type GaAs layer 2 make a Schottky contact, and a depletion layer is generated in the n type GaAs layer under the gate electrode. The thickness of this depletion layer can be varied by a gate bias voltage applied to the gate electrode, thereby controlling an electrical current flowing between the drain and the source. The Schottky contact described above is extremely stable under high temperature operation, and this gate electrode comprising the refractory metal is effective for a high reliability gate electrode in a high output FET. Actually, in both a high temperature storage test (temperature: 300° C., 200 hours) and a high temperature operation test (temperature: 200° C., drain current: $I_{dss}2$, 100 hours), no deterioration of the Schottky contact characteristic of the gate electrode and the n type GaAs layer was observed.

However, in the above-described FET having the refractory metal gate electrode, when the reverse bias voltage applied to the gate electrode is a voltage at which a gate current starts to flow, i.e., a voltage close to the breakdown voltage, a so-called $I_d$ drifting phenomenon occurs in which the drain current, $I_d$ fluctuates with time for several to several tens of seconds, thereby resulting in a large obstacle in enhancing the performance of the FET. On the other hand, the FET having a gate electrode comprising a metal (Ti/Pt/Au and the like) which is formed by evaporation and lift off does not significantly exhibit this phenomenon.

A typical example of this $I_d$ drifting phenomenon will be described. This is a phenomenon in which, as shown in FIG. 6, the $I_d$ when the same gate-bias voltage is applied differs greatly: (a) when the $I_d$-$V_d$ characteristic is measured after applying a forward bias voltage to the gate electrode (dashed lines in the figure); and (b) when the $I_d$-$V_d$ characteristic is measured after a reverse bias voltage near the breakdown voltage is applied to the gate electrode (solid lines in the figure). In the figure, $V_d$ represents the drain voltage and $V_g$ represents the gate bias voltage. This phenomenon can be repeatedly reproduced, which indicates that the Schottky contact between the gate electrode and the n type GaAs layer is not destroyed when the reverse bias voltage near the breakdown voltage is applied to the gate electrode.

The mechanism of the drifting phenomenon will be described. Usually, there is a spontaneous oxide film of GaAs (a mixed film of a Ga oxide film ($Ga_2O_3$) and a As oxide film ($As_2O_3$)) formed on the surface of GaAs. Therefore, as shown in FIG. 7(a), when the gate electrode 4 is formed on the n type GaAs layer 2, which is an active layer of the FET, the n type GaAs layer and the gate electrode make a Schottky contact, with a metamorphic layer comprising the GaAs spontaneous oxide file 8 between the GaAs layer and the gate electrode. In this interface metamorphic layer, there are interface levels due to oxygen, and the majority of these interface levels are deep levels. Furthermore, the majority of the interface levels are electron trapping levels, and they capture electrons and are negatively charged. In the figure, reference numeral 21 designates the interface levels which are thus negatively charged. On the other hand, a depletion layer 20 is formed in the n type GaAs layer under the gate electrode. In this depletion layer, there are no electrons in the conduction band, and there are only positive charges of ionized donors. When a reverse bias voltage is applied to the gate electrode so that a gate current start to flow (to the vicinity of the breakdown voltage), a hole current starts to flow from the n type GaAs layer 2 to the gate electrode 4 and a part of the interface levels which were negatively charged are neutralized as shown in FIG. 7(b). Then, even when the gate bias voltage is returned to close to zero V, these neutralized interface levels maintain their electrically neutral states for a while. Accordingly, the depletion layer in the n type GaAs layer becomes thin and the amount of positive charge due to the ionized donors is reduced. Therefore, the drain current for the same gate bias voltage becomes larger after applying a reverse bias voltage near the breakdown voltage than before doing so. This is thought to be the cause of the $I_d$ drifting phenomenon.

In order to prevent the occurrence of the $I_d$ drifting phenomenon, it is necessary to prevent the formation of the interface levels (electron trapping levels) in the interface metamorphic layer.

SUMMARY OF THE INVENTION

It is an object of the present invention to provide an electrode of a semiconductor device that has a Schottky contact with a semiconductor layer, which is thermally stable, and that prevents the occurrence of the $I_d$ drifting phenomenon.

It is another object of the present invention to provide a method for fabricating this electrode of the semiconductor device.

Other objects and advantages of the invention will become apparent from the detailed description that follows. The detailed description and specific embodiments described are provided only for illustration since various additions and modifications within the scope of the invention will be apparent to those of skill in the art from the detailed descriptions.

According to a first aspect of the present invention, an electrode of a semiconductor device comprises an oxygen absorbing layer comprising a material which is easily bonded with oxygen and disposed on a surface of a semiconductor layer, and a refractory metal layer disposed on the oxygen absorbing layer. Therefore, the oxygen in an interface metamorphic layer located between the semiconductor layer and the oxygen absorbing layer is taken into the oxygen absorbing layer. This prevents the formation of the interface levels (electron trapping levels) due to the oxygen in the interface metamorphic layer, and, in an FET having this electrode as a gate electrode, an $I_d$ drifting phenomenon is prevented.

According to a second aspect of the present invention, in the electrode of a semiconductor device described in the first aspect of the present invention, the cross-section of the refractory metal layer is T-shaped, whose upper width is larger than its lower width. Therefore, the resistance of the electrode is reduced and the high frequency characteristics of the FET having this electrode as the gate electrode are improved. Furthermore, since the electrode has the oxygen absorbing layer, the formation of the interface levels (electron trapping levels) due to the oxygen in the interface metamorphic layer is prevented, thereby preventing the $I_d$ drifting phenomenon.

According to a third aspect of the present invention, the electrode of a semiconductor device described in the first aspect of the present invention further comprises a low resistivity metal layer disposed on the refractory metal layer. Therefore, the electrode resistance is further reduced and the high frequency characteristics of the FET having this electrode as the gate electrode are improved. Furthermore, the formation of the interface levels (electron trapping levels) within the interface metamorphic layer is prevented, thereby preventing the $I_d$ drifting phenomenon.

According to a fourth aspect of the present invention, the electrode of a semiconductor device described in the second aspect of the present invention further comprises a low resistivity metal layer disposed on the refractory metal layer. Therefore, the electrode resistance is further reduced and the high frequency characteristics of the FET having this electrode as the gate electrode are improved. Furthermore, the formation of the interface levels (electron trapping levels) within the interface metamorphic layer is prevented, thereby preventing the $I_d$ drifting phenomenon.

According to a fifth aspect of the present invention, in the electrode of a semiconductor device described in the first aspect of the present invention, the oxygen absorbing layer comprises a material selected from the group consisting of Ti, TiN, and Ni. When the oxygen absorbing layer comprises the Ti or the TiN, the Ti or the TiN makes a contact with GaAs which shows extreme thermal stability, and since they react with $Ga_2O_3$ and $As_2O_3$ which are the constituents of the interface metamorphic layer to form TiO, the oxygen within the interface metamorphic layer is taken into the Ti or TiN layer. When the oxygen absorbing layer comprises the Ni, this Ni reacts with $Ga_2O_3$ within the interface metamorphic layer and forms Ni—O, and the oxygen within the interface metamorphic layer is taken into the Ni layer. Therefore, the formation of the interface levels (electron trapping levels) within the interface metamorphic layer due to the oxygen is prevented, and, in the FET having this electrode as the gate electrode, the $I_d$ drifting phenomenon is prevented. Furthermore, the Ni reacts with the GaAs and the Ni—GaAs alloy layer is formed on the interface between the Ni layer and the n type GaAs layer, producing a thermally stable contact. This improves the Schottky contact characteristic between the gate electrode and the n type GaAs layer. The adhesion between them is also improved.

According to a sixth aspect of the present invention, in the electrode of a semiconductor device described in the second aspect of the present invention, the oxygen absorbing layer comprises a material selected from the group consisting of Ti, TiN, and Ni. When the oxygen absorbing layer comprises the Ti or the TiN, the Ti or the TiN makes a contact with GaAs which shows extreme thermal stability, and since they react with $Ga_2O_3$ and $As_2O_3$ which are the constituents of the interface metamorphic layer to form TiO, the oxygen within the interface metamorphic layer is taken into the Ti or TiN layer. When the oxygen absorbing layer comprises the Ni, this Ni reacts with $Ga_2O_3$ within the interface metamorphic layer and forms Ni—O, and the oxygen within the interface metamorphic layer is taken into the Ni layer. Therefore, the formation of the interface levels (electron trapping levels) within the interface metamorphic layer due to the oxygen is prevented, and, in the FET having this electrode as the gate electrode, the $I_d$ drifting phenomenon is prevented. Furthermore, the Ni reacts with the GaAs and the Ni—GaAs alloy layer is formed on the interface between the Ni layer and the n type GaAs layer, producing a thermally stable contact. This improves the Schottky contact characteristic between the gate electrode and the n type GaAs layer. The adhesion between them is also improved.

According to a seventh aspect of the present invention, in the electrode of a semiconductor device described in the third aspect of the present invention, the oxygen absorbing layer comprises a material selected from the group consisting of Ti, TiN, and Ni. When the oxygen absorbing layer comprises the Ti or the TiN, the Ti or the TiN makes a contact with GaAs which shows extreme thermal stability, and since they react with $Ga_2O_3$ and $As_2O_3$ which are the constituents of the interface metamorphic layer to form TiO, the oxygen within the interface metamorphic layer is taken into the Ti or TiN layer. When the oxygen absorbing layer comprises the Ni, this Ni reacts with $Ga_2O_3$ within the interface metamorphic layer and forms Ni—O, and the oxygen within the interface metamorphic layer is taken into the Ni layer. Therefore, the formation of the interface levels (electron trapping levels) within the interface metamorphic layer due to the oxygen is prevented, and, in the FET having this electrode as the gate electrode, the $I_d$ drifting phenomenon is prevented. Furthermore, the Ni reacts with the GaAs and the Ni—GaAs alloy layer is formed on the interface between the Ni layer and the n type GaAs layer, producing a thermally stable contact. This improves the Schottky contact characteristic between the gate electrode and the n type GaAs layer. The adhesion between them is also improved.

According to an eighth aspect of the present invention, in the electrode of a semiconductor device described in the fourth aspect of the present invention, the oxygen absorbing layer comprises a material selected from the group consisting of Ti, TiN, and Ni. When the oxygen absorbing layer comprises the Ti or the TiN, the Ti or the TiN makes a contact with GaAs which shows extreme thermal stability, and since they react with $Ga_2O_3$ and $As_2O_3$ which are the constituents of the interface metamorphic layer to form TiO, the oxygen within the interface metamorphic layer is taken into the Ti or TiN layer. When the oxygen absorbing layer comprises the Ni, this Ni reacts with $Ga_2O_3$ within the interface metamorphic layer and forms Ni—O, and the oxygen within the interface metamorphic layer is taken into the Ni layer. Therefore, the formation of the interface levels (electron trapping levels) within the interface metamorphic layer due to the oxygen is prevented, and, in the FET having this electrode as the gate electrode, the $I_d$ drifting phenomenon is prevented. Furthermore, the Ni reacts with the GaAs and the Ni—GaAs alloy layer is formed on the interface between the Ni layer and the n type GaAs layer, producing a thermally stable contact. This improves the Schottky contact characteristic between the gate electrode and the n type GaAs layer. The adhesion between them is also improved.

According to a ninth aspect of the present invention, in the electrode of a semiconductor device described in the fifth aspect of the present invention, the oxygen absorbing layer is 1–20 nm thick. Therefore, the oxygen absorbing layer has enough thickness to take in the oxygen from the interface metamorphic layer, and, in the FET having this electrode as the gate electrode, the $I_d$ drifting phenomenon is prevented. Furthermore, a thermal stability of the electrode obtained by using the refractory metal layer is still maintained for the above described thickness of the oxygen absorbing layer.

According to a tenth aspect of the present invention, in the electrode of a semiconductor device described in the sixth aspect of the present invention, the oxygen absorbing layer is 1–20 nm thick. Therefore, the oxygen absorbing layer has enough thickness to take in the oxygen from the interface metamorphic layer, and, in the FET having this electrode as the gate electrode, the $I_d$ drifting phenomenon is prevented. Furthermore, a thermal stability of the electrode obtained by using the refractory metal layer is still maintained for the above described thickness of the oxygen absorbing layer.

According to an eleventh aspect of the present invention, in the electrode of a semiconductor device described in the seventh aspect of the present invention, the oxygen absorbing layer is 1–20 nm thick. Therefore, the oxygen absorbing layer has enough thickness to take in the oxygen from the interface metamorphic layer, and, in the FET having this electrode as the gate electrode, the $I_d$ drifting phenomenon is prevented. Furthermore, a thermal stability of the electrode obtained by using the refractory metal layer is still maintained for the above described thickness of the oxygen absorbing layer.

According to a twelfth aspect of the present invention, in the electrode of a semiconductor device described in the eighth aspect of the present invention, the oxygen absorbing layer is 1–20 nm thick. Therefore, the oxygen absorbing layer has enough thickness to take in the oxygen from the interface metamorphic layer, and, in the FET having this electrode as the gate electrode, the $I_d$ drifting phenomenon is prevented. Furthermore, a thermal stability of the electrode obtained by using the refractory metal layer is still maintained for the above described thickness of the oxygen absorbing layer.

According to a thirteen aspect of the present invention, a method for fabricating an electrode of a semiconductor device comprises disposing a first insulating film on a semiconductor layer; etching a portion of the first insulating film where a recess groove on the semiconductor layer is to be formed to form an opening in the first insulating film; etching a portion of the semiconductor layer exposed through the opening to form the recess groove; disposing a second insulating film on the entire surface; anisotropically etching the second insulating film to form a side wall on the lateral surfaces of the opening of the first insulating film and the recess groove; successively depositing on the entire surface an oxygen absorbing layer comprising a material which is easily bonded to oxygen, a refractory metal layer, and a low resistivity metal layer, thereby forming an electrode laminated layer; removing portions of the electrode laminated layer not becoming an upper portion of an electrode; and removing the first insulating film and the second insulating film by etching to form an electrode which has a T-shaped cross-section, the upper width being larger than the lower width, and comprises the oxygen absorbing layer, the refractory metal layer, and the low resistivity metal layer. Therefore, the electrode which has the oxygen absorbing layer at the bottom and the cross-section of which is T-shaped is stably produced. Since this electrode has the low resistivity metal layer on the refractory metal layer and its cross-section is T-shaped, the electrical resistance is reduced, and the high frequency characteristics of the FET having this electrode as the gate electrode are improved. Furthermore, since the oxygen within the interface metamorphic layer can be taken into the oxygen absorbing layer, the formation of the interface levels (electron trapping levels) due to the oxygen within the interface metamorphic layer is prevented, thereby preventing the $I_d$ drifting phenomenon.

According to a fourteenth aspect of the present invention, in the method for fabricating an electrode of a semiconductor device described in the thirteenth aspect of the present invention, the oxygen absorbing layer is deposited so that the oxygen absorbing layer is 1–20 nm thick. Therefore, when the first and second insulating films are removed by etching, since the oxygen absorbing layer is as thin as 20 nm or less, the oxygen absorbing layer is not etched and the detachment of the electrode from the semiconductor layer does not happen, thereby stably forming the electrode. Since the oxygen absorbing layer has enough thickness to take in the oxygen from the interface metamorphic layer, in the FET having this electrode as the gate electrode, the $I_d$ drifting phenomenon is prevented. Furthermore, the thermal stability of the electrode obtained by using the refractory metal layer is still maintained for the above described thickness of the oxygen absorbing layer.

BRIEF DESCRIPTION OF THE PREFERRED EMBODIMENTS

Embodiment 1

A first embodiment of the present invention will be described.

Figure 1:
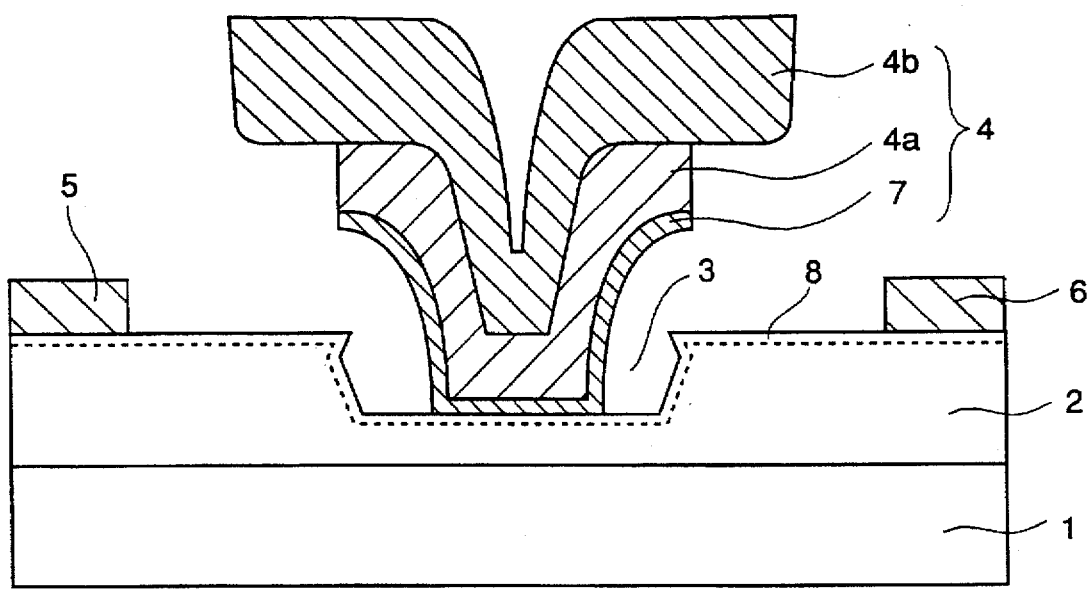
FIG. 1 is a cross-sectional view illustrating a gate electrode of a GaAs MESFET according to first, second, and third embodiments of the present invention.
Figure 5:
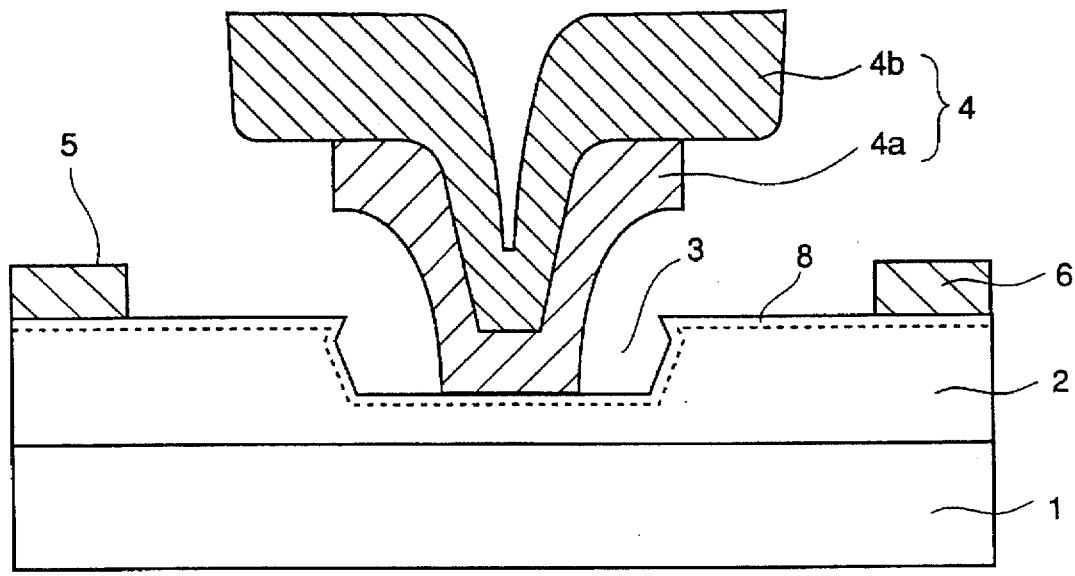
FIG. 5 is a cross-sectional view illustrating a conventional T-shaped refractory metal gate electrode.

FIG. 1 shows a gate electrode of a GaAs MESFET according to the first embodiment of the present invention. Reference numeral 1 designates a semi-insulating GaAs substrate, reference numeral 2 designates an n type GaAs layer which is the active layer of the FET, reference numeral 3 designates a recess groove, reference numeral 4 designates a gate electrode, reference numeral 4a designates a WSi layer, reference numeral 4b designates an Au layer, reference numeral 5 designates a source electrode, reference numeral 6 designates a drain electrode, reference numeral 7 designates an oxygen absorbing layer comprising Ti, and reference numeral 8 designates a GaAs spontaneous oxide film. The GaAs spontaneous oxide film is an extremely thin oxide film spontaneously formed on the surface of GaAs when GaAs is exposed to the atmosphere. Although the fundamental structure of this electrode resembles the structure of the T-shaped gate electrode of the conventional GaAs MESFET illustrated in FIG. 5, the novel electrode has the oxygen absorbing layer 7 of 10 nm thickness comprising Ti disposed between the n type GaAs layer 2 and the WSi layer 4a.

Figure 2:
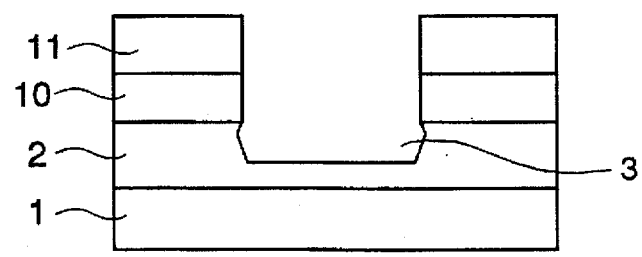
FIGS. 2(a)–2(e) are cross-sectional views illustrating a method for fabricating a GaAs MESFET according to the first, second, and third embodiments of the present invention.
Figure 2:
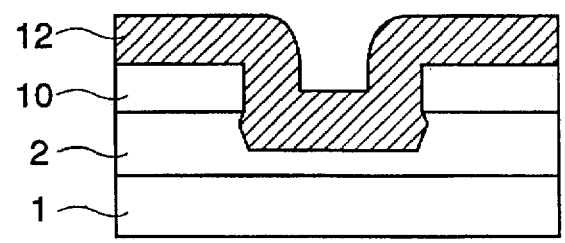
Figure 2:
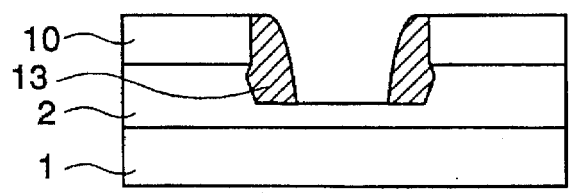
Figure 2:
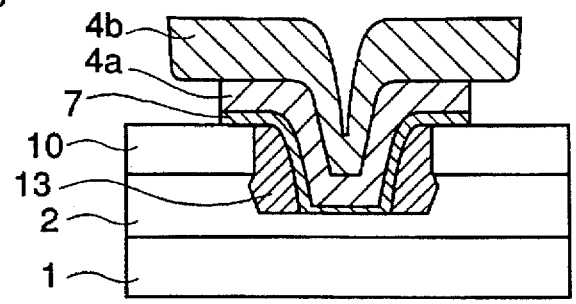
Figure 2:
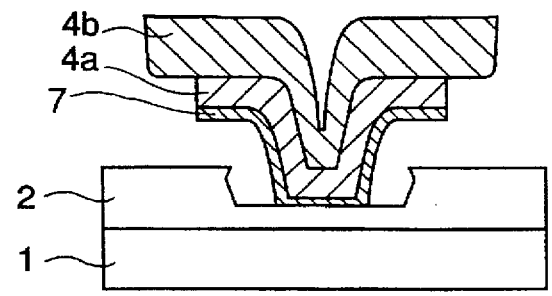

FIGS. 2(a)–2(e) illustrate a method for fabricating the gate electrode of the GaAs MESFET of this embodiment. First, a first SiO film about 200 nm thick is deposited on the entire surface of the n type GaAs layer 2 about 350 nm thick. Next, a photo resist 11 having an opening in a region where the recess groove is to be formed is formed and, using this photo resist as a mask, as shown in FIG. 2(a), the first SiO film 10 is etched, thereby forming an opening. Furthermore, using this first SiO film as a mask, the n type GaAs layer 2 is etched, thereby forming the recess groove 3. The depth of the recess groove should be about 300 nm. Next, after removing the photo resist 11, as shown in FIG. 2(b), a second SiO film, 200 to 400 nm thick is deposited on the entire surface. Furthermore, as shown in FIG. 2(c), the second SiO film is anisotropically etched so that the second SiO film remains only on the inner surfaces of the opening of the first SiO film and the recess groove, thereby forming an SiO side wall 13. The width of the opening formed by this SiO side wall (distance between the side walls) should be about 0.3 μm, and this becomes the gate length. The width of the opening can be controlled by controlling the width of the opening in the first SiO film and the thickness of the second SiO film. Next, the Ti layer 7 10 nm thick, the WSi layer 4a about 200 nm thick, and the Au layer 4b about 400 nm thick are successively deposited on the entire surface by sputtering. Furthermore, after forming a resist on a part of the Au layer 4b where the upper portion of the gate electrode is to be formed, using this resist as a mask, the Au layer is etched by ion milling, and the WSi layer and the Ti layer are further etched by reactive ion etching, thereby forming the Ti layer 7, the WSi layer 4a, and the Au layer 4b of the gate electrode. Next, as shown in FIG. 2(d), the resist disposed on the Au layer 4b is removed. Then, the first SiO film 10 and the SiO side wall 13 are removed using a hydrofluoric acid based etchant, thereby obtaining the gate electrode of the T-shaped cross-section having the Ti layer 7 serving as the oxygen absorbing layer at the lowest layer of the electrode and the WSi layer 4a and the Au layer 4b laminated on the Ti layer as shown in FIG. 2(e). Next, by forming the source electrode 5 and the drain electrode 6, the GaAs MESFET illustrated in FIG. 1 is produced.

Figure 3:
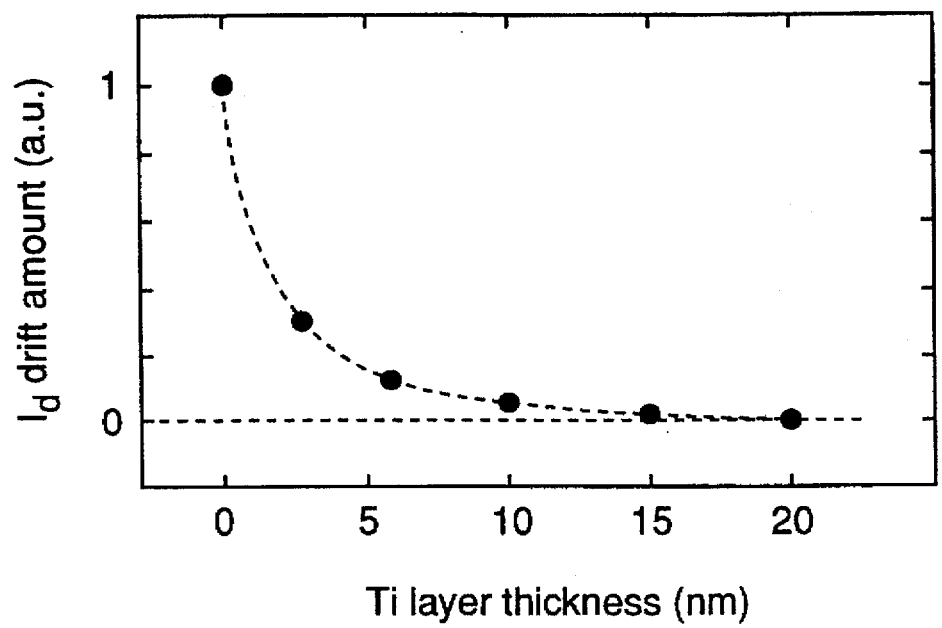
FIG. 3 is a graph showing Ti layer thickness dependence of $I_d$ drifting of a GaAs MESFET having a gate electrode according to the first embodiment of the present invention.
Figure 4:
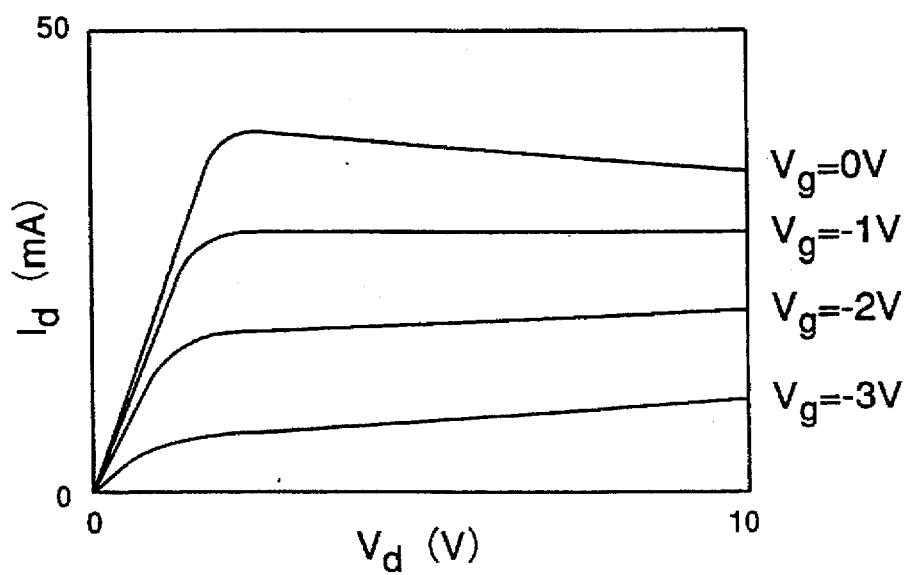
FIG. 4 is a graph showing an $I_d$-$V_d$ characteristic of the GaAs MESFET having the gate electrode according to the first embodiment of the present invention.
Figure 6:
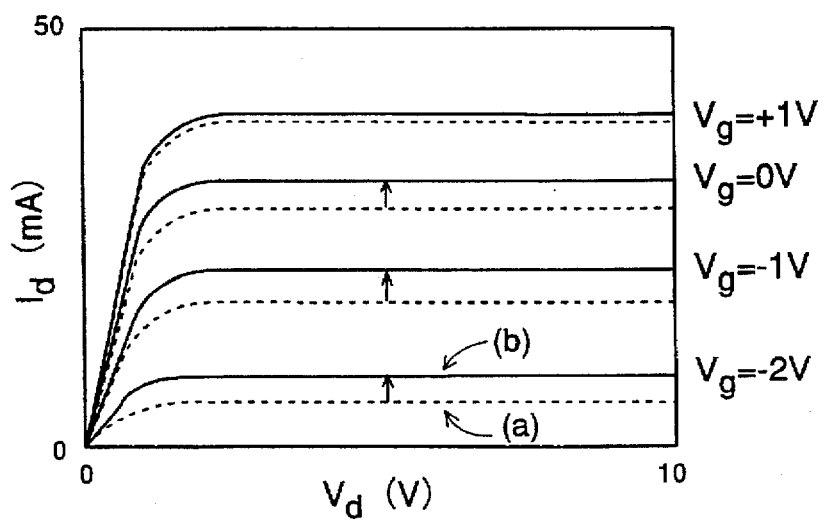
FIG. 6 is a graph showing an $I_d$-$V_d$ characteristic of a conventional GaAs MESFET having a T-shaped refractory metal gate electrode.
Figure 7:
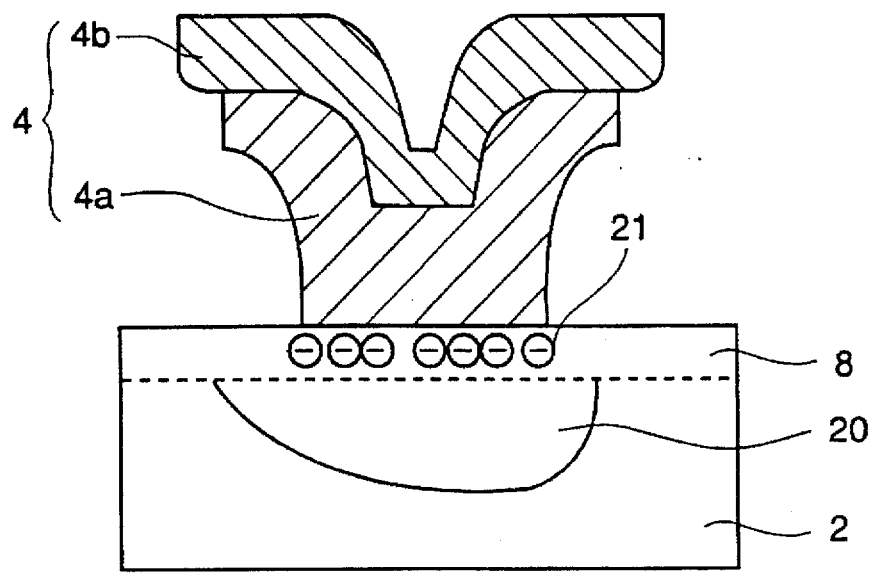
FIGS. 7(a) and 7(b) are cross-sectional views describing a cause in a $I_d$ drifting phenomenon of the conventional GaAs MESFET having the refractory metal gate electrode.
Figure 7:
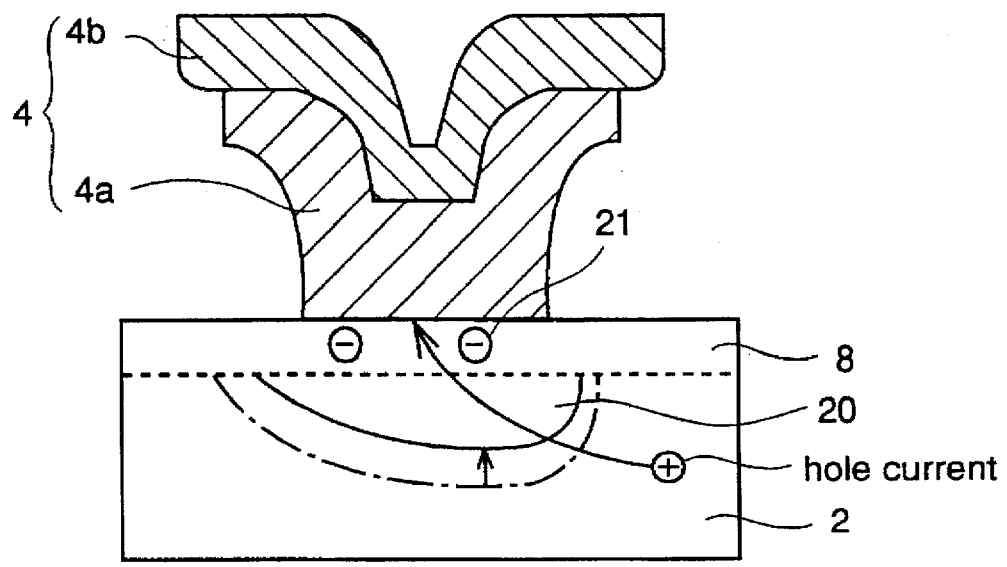

The Ti layer thickness dependence of the $I_d$ drifting amount of the GaAs MESFET having the gate electrode according to this embodiment is shown in FIG. 3. The $I_d$ drifting amount is the difference between the drain current $I_d$ which is measured after a reverse bias voltage applied to the gate electrode is increased to the vicinity of the breakdown voltage and the $I_d$ which is measured after a forward bias voltage is applied to the gate electrode. The measurements of the $I_d$'s for both cases are made for the same gate bias voltage. The $I_d$ drifting amount represented by the ordinate of the graph has been normalized by dividing by the $I_d$ drifting amount with the thickness of the Ti layer being equal to 0 nm. From the graph, it can be seen that the $I_d$ drifting amount is totally eliminated for a thickness of the Ti layer equal to 20 nm. FIG. 4 shows the $V_d$-$I_d$ characteristic obtained after the reverse bias voltage applied to the gate electrode of the GaAs MESFET according to this embodiment (the thickness of the Ti layer being 10 nm) is increased to near the breakdown voltage (represented by the solid lines in the graph) and the $V_d$-$I_d$ characteristic obtained after a forward bias voltage is applied to the gate electrode of the same FET (represented by the dashed lines in the graph). These $V_d$-$I_d$ characteristics are almost the same (the solid lines and the dashed lines are on top of each other), and a significant shift of $I_d$'s such as the shift observed in the conventional FET illustrated in FIG. 6 is not observed. As described above, it can be seen that the gate electrode according to this embodiment having the oxygen absorbing layer comprising Ti at the bottom of the gate electrode is effective in preventing the $I_d$ drifting phenomenon.

As described above, there is the GaAs spontaneous oxide film 8 formed on the surface of the n type GaAs layer 2, and the n type GaAs layer and the gate electrode make a Schottky contact, with the interface metamorphic layer comprising the GaAs spontaneous oxide film between the GaAs layer and the gate electrode. In this interface metamorphic layer, there exist interface levels (electron trapping levels) due to oxygen, and these interface levels become negatively charged (by capturing electrons) or neutralized (by capturing holes, that is, releasing electrons) with a dependence on the gate bias voltage applied to the gate electrode. For this reason, the thickness of the depletion layer in the n type GaAs layer varies and the $I_d$ drifting phenomenon occurs. However, in this embodiment, as will be described below, the formation of the interface levels (electron trapping levels) can be prevented.

In this embodiment, the oxygen absorbing layer, which is the lowest layer of the gate electrode, comprises a Ti layer. The bonding energies of an oxygen atom to Ga, As, and Ti atoms are compared. The bonding energies for Ga—O and As—O are 84.5 kcal/mol and 115.0 kcal/mol, respectively, whereas the bonding energy for Ti—O is 160.7 kcal/mol. This means that Ti bonds to oxygen far more easily than to Ga and As. Therefore, the Ti layer takes oxygen from the interface metamorphic layer comprising the GaAs spontaneous oxide film (mixed film of the Ga oxide film ($Ga_2O_3$) and the As oxide film ($As_2O_3$)) located between the Ti layer and the n type GaAs layer, preventing the formation of the interface levels (electron trapping levels) due to oxygen in the interface metamorphic layer. For this reason, the $I_d$ drifting phenomenon is prevented.

Furthermore, in this embodiment, the Ti layer makes contact with the GaAs layer which shows extreme thermal stability. In addition, since the Ti layer is as thin as 20 nm or less, the thermal stability of the gate electrode obtained by using a refractory metal layer is maintained. That is, the thermal stability of the conventional gate electrode utilizing a WSi layer is not spoiled by the Ti layer.

Furthermore, in the method for fabricating the gate electrode according to this embodiment, since the Ti layer is as thin as 20 nm or less, when the first SiO film 10 and the SiO side wall 13 are removed using the hydrofluoric acid based etchant, the Ti layer will not be etched. As a result, stable formation of the gate electrode is possible (if the Ti layer 7 is thicker than 20 nm, the Ti layer will be etched and the gate electrode will be detached from the n type GaAs layer).

Furthermore, since, for the gate electrode according to this embodiment, the cross-section is T-shaped and a Au layer which comprises low resistivity metal layer is formed on the WSi layer, the electrical resistance of the gate electrode is reduced, thereby improving high frequency characteristics of the FET.

In the method for fabricating the gate electrode according to this embodiment, although the insulating film of the etching mask for the recess formation and the side wall insulating film for the formation of the T-shaped gate electrode utilize an SiO film, an SiON film may also be used.

Embodiment 2

A second embodiment of the present invention will be described.

A gate electrode of a GaAs MESFET according to the second embodiment is the gate electrode illustrated in FIG. 1 in which the oxygen absorbing layer 7 comprises a TiN layer of 1–20 nm thickness. Except for this layer, the structure of the electrode is the same as the structure described in the first embodiment.

The fabricating method of the gate electrode of the GaAs MESFET of this embodiment is the same as the fabricating method illustrated in FIGS. 2(a)–2(e) except that the oxygen absorbing layer 7 is formed by depositing the TiN layer (composition ratio of N: 10–50%) by reactive. sputtering. Except for this, the fabricating method is the same as the fabricating method of the first embodiment.

In this embodiment, as in the first embodiment, the TiN layer, which is the lowest layer of the gate electrode, takes oxygen from the interface metamorphic layer comprising the GaAs spontaneous oxide film located between the TiN layer and the n type GaAs layer, thereby preventing the formation of the interface levels (electron trapping levels) due to oxygen in the interface metamorphic layer. The dependence on the TiN layer thickness of the $I_d$ drifting amount of the GaAs MESFET having the gate electrode according to this embodiment shows the same tendency as the Ti layer thickness dependence of the $I_d$ drifting amount of a GaAs MESFET having the gate electrode according to the first embodiment illustrated in FIG. 3. That is, a gate electrode according to the second embodiment having an oxygen absorbing layer comprising TiN at the bottom of the gate electrode is as effective as the gate electrode according to the first embodiment in preventing the $I_d$ drifting phenomenon.

Furthermore, in this embodiment, the TiN layer makes contact with the GaAs layer and shows extreme thermal stability. In addition, since the TiN layer is as thin as 20 nm or less, the thermal stability of the gate electrode obtained by using the refractory metal layer can be maintained.

Furthermore, in the method for fabricating the gate electrode of this embodiment, since the TiN layer 7 is as thin as 20 nm or less, when the first SiO film 10 and the SiO side wall 13 are removed using a hydrofluoric acid based etchant, the TiN layer will not be etched. Therefore, stable formation of the gate electrode is possible.

Furthermore, since the gate electrode of this embodiment, like the gate electrode of the first embodiment, has a T-shaped cross-section and the Au layer, which is a low resistivity metal layer, is formed on the WSi layer, the electrical resistance of the gate electrode is reduced, thereby improving high frequency characteristics of the FET.

Embodiment 3

A third embodiment of the present invention will be described.

A gate electrode of a GaAs MESFET according to this embodiment is the same as the electrode illustrated in FIG. 1 except that the oxygen absorbing layer 7 comprises an Ni layer of 1–20 nm thickness. Except for this, the electrode structure is the same as the structure described in the first embodiment.

The method for fabricating the gate electrode of the GaAs MESFET according to this embodiment is the same as the fabricating method illustrated in FIGS. 2(a)–2(e) except that the oxygen absorbing layer 7 is formed by depositing the Ni layer by vacuum evaporation. Except for this, the fabricating method is the same as the fabricating method according to the first embodiment.

In this embodiment, the bottom layer of the gate electrode is the Ni layer. The bonding energies of an oxygen atom to a Ga atom, an As atom, and an Ni atom are compared. The bonding energies for Ga—O and As—O are, as previously described, 84.5 kcal/mol and 115.0 kcal/mol, respectively, whereas the bonding energy for Ni—O is 91.3 kcal/mol, indicating that Ni is bonded to O less easily than As is but Ni is bonded to O more easily than Ga is. Therefore, it is considered that the Ni layer takes some oxygen from the interface metamorphic layer comprising the GaAs spontaneous oxide film located between the Ni layer and the n type GaAs layer, thereby preventing the formation of the interface levels (electron trapping levels) due to the oxygen in the interface metamorphic layer. The Ni layer thickness dependence of the $I_d$ drifting amount of the GaAs MESFET having the gate electrode according to this embodiment shows the same tendency as the Ti layer thickness dependence of the $I_d$ drifting amount of the GaAs MESFET having the gate electrode according to the first embodiment illustrated in FIG. 3. That is, the gate electrode of the third embodiment having the oxygen absorbing layer comprising Ni at the bottom of the gate electrode is as effective as the gate electrodes of the first and second embodiments in preventing the $I_d$ drifting phenomenon.

Furthermore, by a heat treatment carried out at around 300° C., Ni reacts with GaAs so that an Ni—GaAs alloy layer is formed on the interface between the Ni layer and the n type GaAs layer, producing a thermally stable contact. This improves the Schottky contact characteristic between the gate electrode and the n type GaAs layer, and the adhesion between them is also improved.

Furthermore, in this embodiment, since the Ni layer is as thin as 20 nm or less, the thermal stability of the gate electrode using a refractory metal layer is maintained.

Furthermore, in the method for fabricating a gate electrode according to this embodiment, since the Ni layer 7 is as thin as 20 nm or less, when the first SiO film 10 and the SiO side wall 13 are removed using hydrofluoric acid based etchant, the Ni layer will not be etched. Therefore, stable formation of the gate electrode is possible.

Furthermore, since the gate electrode according to this embodiment, as in the first and second embodiments, has a T-shaped cross-section and a Au layer of a low resistivity is formed on the WSi layer, the electrical resistance of the gate electrode is reduced and high frequency characteristics of the FET are improved.

What is claimed is:

1. An electrode of a semiconductor device comprising:
   a semiconductor layer having a surface;
   an oxygen absorbing layer comprising a material disposed on the surface of the semiconductor layer; and
   a refractory metal compound layer disposed on said oxygen absorbing layer.

2. The electrode of a semiconductor device of claim 1 wherein said refractory metal compound layer has a T-shaped cross-section with a larger upper width than lower width.

3. The electrode of a semiconductor device of claim 2 comprising a metal contacting layer disposed on said refractory metal compound layer and having a lower resistivity than said refractory metal compound layer.

4. The electrode of a semiconductor device of claim 3 wherein said oxygen absorbing layer comprises a material selected from the group consisting of Ti, TiN, and Ni.

5. The electrode of a semiconductor device of claim 4 wherein said oxygen absorbing layer is 1 to 20 nm thick.

6. The electrode of a semiconductor device of claim 2 wherein said oxygen absorbing layer comprises a material selected from the group consisting of Ti, TiN, and Ni.

7. The electrode of a semiconductor device of claim 6 wherein said oxygen absorbing layer is 1 to 20 nm thick.

8. The electrode of a semiconductor device of claim 1 comprising a metal contacting layer disposed on said refractory metal compound layer end having a lower resistivity than said refractory metal compound layer.

9. The electrode of a semiconductor device of claim 8 wherein said oxygen absorbing layer comprises a material selected from the group consisting of Ti, TiN, and Ni.

10. The electrode of a semiconductor device of claim 9 wherein said oxygen absorbing layer is 1 to 20 nm thick.

11. The electrode of a semiconductor device of claim 1 wherein said oxygen absorbing layer comprises a material selected from the group consisting of Ti, TiN, and Ni.

12. The electrode of a semiconductor device of claim 11 wherein said oxygen absorbing layer is 1 to 20 nm thick.

13. The electrode of a semiconductor device of claim 1 wherein said oxygen absorbing layer and said refractory metal compound layer together form a Schottky contact with said semiconductor layer.

14. The electrode of a semiconductor device of claim 1 wherein said semiconductor layer is a compound semiconductor material.

15. The electrode of a semiconductor device of claim 14 wherein said compound semiconductor material is GaAs.

16. The electrode of a semiconductor device of claim 1 wherein said refractory metal compound layer is WSi.

* * * * *